United States Patent
Lafian et al.

(10) Patent No.: US 11,210,933 B2
(45) Date of Patent: Dec. 28, 2021

(54) IRRIGATION SPRINKLER BODY COVER WITH AN INTEGRATED BATTERY-POWERED DECODER

(71) Applicants: Jesse Lafian, Athens, GA (US); John Dowd, Watkinsville, GA (US); Ray McLin, Summerville, SC (US)

(72) Inventors: Jesse Lafian, Athens, GA (US); John Dowd, Watkinsville, GA (US); Ray McLin, Summerville, SC (US)

( * ) Notice: Subject to any disclaimer, the term of this patent is extended or adjusted under 35 U.S.C. 154(b) by 0 days.

(21) Appl. No.: 16/908,002

(22) Filed: Jun. 22, 2020

(65) Prior Publication Data

US 2020/0320860 A1 Oct. 8, 2020

Related U.S. Application Data

(63) Continuation-in-part of application No. 16/516,217, filed on Jul. 18, 2019.
(Continued)

(51) Int. Cl.
*G05B 11/01* (2006.01)
*G08C 19/16* (2006.01)
(Continued)

(52) U.S. Cl.
CPC .......... *G08C 17/02* (2013.01); *A01G 25/165* (2013.01); *A01G 25/167* (2013.01); *B05B 15/16* (2018.02); *H01F 7/08* (2013.01); *H02S 40/38* (2014.12); *H04W 4/023* (2013.01); *H04W 76/14* (2018.02); *H05K 5/064* (2013.01); *H05K 7/1427* (2013.01); *G08C 2201/20* (2013.01); *H04W 88/04* (2013.01); *H04W 88/16* (2013.01)

(58) Field of Classification Search
CPC .... G08C 17/02; G08C 2201/20; B05B 15/16; H04W 84/18; H04W 76/14; H04W 4/023; H04W 88/04; H04W 88/16; H05K 7/1427; H05K 5/064; H02S 40/38; A01G 25/16; A01G 25/167; A01G 25/165; H01F 7/08; Y02P 60/12; Y02A 40/22; Y02E 70/30; Y02E 10/50
USPC ......................................................... 340/12.5
See application file for complete search history.

(56) References Cited

U.S. PATENT DOCUMENTS

| | | | | |
|---|---|---|---|---|
| 2005/0107924 A1* | 5/2005 | Bailey | ................... | A01G 25/16 |
| | | | | 700/284 |
| 2007/0179674 A1* | 8/2007 | Ensworth | .............. | H04W 88/00 |
| | | | | 700/284 |
| 2013/0173070 A1* | 7/2013 | Tennyson | ............... | G05B 19/02 |
| | | | | 700/284 |

* cited by examiner

*Primary Examiner* — Tanmay K Shah
(74) *Attorney, Agent, or Firm* — White-Welker & Welker, LLC; Matthew T. Welker, Esq.

(57) ABSTRACT

An apparatus comprising an irrigation sprinkler body cover with an integrated battery-powered decoder is disclosed. A method of retrofitting existing irrigation systems to wirelessly communicate with one or more of the present apparatus is also disclosed. Concerning the present method, an irrigation controller provides message data to a gateway regarding the control of irrigation valves. The gateway contains configurable encoder software that encodes and then wirelessly transmits the message data, for example via long-range radio hardware at 902-928 MHz frequency. The encoded data is received by a present apparatus to which the message is addressed. The apparatus decodes the message data and subsequently provides a power signal via wire to one or more proximally-located DC latching solenoid valves to control the irrigation valves according to the user input.

7 Claims, 17 Drawing Sheets

Related U.S. Application Data

(60) Provisional application No. 62/864,357, filed on Jun. 20, 2019, provisional application No. 62/699,972, filed on Jul. 18, 2018.

(51) Int. Cl.
| | |
|---|---|
| *G08C 17/02* | (2006.01) |
| *B05B 15/16* | (2018.01) |
| *H04W 76/14* | (2018.01) |
| *H04W 4/02* | (2018.01) |
| *H05K 7/14* | (2006.01) |
| *H05K 5/06* | (2006.01) |
| *H02S 40/38* | (2014.01) |
| *A01G 25/16* | (2006.01) |
| *H01F 7/08* | (2006.01) |
| *H04W 88/04* | (2009.01) |
| *H04W 88/16* | (2009.01) |

16

IRRIGATION SPRINKLER BODY COVER WITH AN INTEGRATED BATTERY-POWERED DECODER

TECHNICAL FIELD OF THE INVENTION

The present invention relates generally to long-range wireless communication within irrigation systems. More specifically, the present invention relates to an apparatus and method to conveniently enable irrigation controllers and decoders to communicate wirelessly over long distances.

BACKGROUND OF THE INVENTION

In applications such as golf-course and commercial-landscape irrigation, two-wire irrigation is being increasingly installed and utilized. Two-wire irrigation is especially beneficial on large sites where it enables significantly reduced wire usage and thus reduced material and labor costs.

As opposed to conventional irrigation, in which each individual solenoid valve on a site is wired directly to a central controller, two-wire irrigation utilizes a daisy-chain wire path from a controller to at least one (typically many) solenoid valves on a site. In both types of systems, a 24VAC current is sent via wire from the controller; when the current reaches a solenoid valve, the valve opens, enabling water to flow through the valve to the sprinklers and ultimately to the plants needing water. In conventional systems, the 24VAC signal is received uninterrupted by the solenoid valve. In two-wire systems, an electrical apparatus called a decoder intercepts the 24VAC current from the controller. Decoders are spliced into the aforementioned daisy-chain wire path; an individual decoder connects this wire path to an individual solenoid valve (or sometimes several solenoid valves). Each decoder has a unique serial number that is programmed into the controller in order to distinguish it from the others in the system. Decoders thus enable controllers of two-wire systems to complete a circuit between the controller and an individual solenoid valve, thereby enabling the opening of one valve at a time.

There are presently thousands of such two-wire irrigation systems throughout the United States. Unfortunately, these systems are complex and time-consuming to install and troubleshoot. Two-wire systems typically comprise different parts including wire, a master valve decoder, zone valve decoders, surge arresters, grounding rods, and extra valve boxes for the surge arresters and grounding rods. Installing, let alone troubleshooting, a two-wire system requires significant training, knowledge, and skill. Further, concerning maintenance, damaged or cut wire is a ubiquitous problem that renders valves inoperable until an irrigation system is fixed. This can cause loss of plant material, thereby frustrating property owners and reducing profit for irrigation contractors.

Because of these disadvantages of two-wire irrigation systems—namely complexity and susceptibility to damaged or cut wire—a need remains for a simple and effective apparatus to enable irrigation controllers and decoders to communicate wirelessly over long distances.

DEFINITIONS

An Irrigation System is an apparatus that enables the application of controlled amounts of water to plants at needed intervals. In commercial-landscape and golf-course settings, for example, an irrigation system is typically automated and comprises three main parts—a controller, solenoid valves, and sprinklers.

A Controller is the brain of an irrigation system that tells the solenoid valves when and how long to supply water to the sprinklers. Most controllers have a means of setting the frequency of irrigation, the start time, and the duration of watering. Some controllers have additional features such as multiple programs to allow different watering frequencies for different types of plants, rain delay settings, input terminals for sensors such as rain/freeze/soil moisture sensors, weather data, and remote operation.

A Solenoid is an electromechanical apparatus that uses an electric current to generate a magnetic field and thereby operate a mechanism which, in the context of irrigation, regulates the opening of and fluid flow through a valve. In both conventional and two-wire irrigation systems, 24VAC solenoids are standard; activation of these solenoids requires a continuous application of AC current. In contrast, DC latching solenoids include internal magnets that enable solenoid activation by a brief pulse, for example 80 milliseconds, of DC current. 9VDC latching solenoids are routinely used in conjunction with battery-powered controllers, for example in parking-lot islands where wire cannot be easily routed. A standard 9V alkaline battery has sufficient amperage to activate and deactivate a 9VDC latching solenoid many times.

A Sprinkler is an apparatus used to apply water to plants in a controlled manner that is similar to rainfall.

A Sprinkler Body is a plastic enclosure that contains a sprinkler, a solenoid valve, and at least one compartment that may be configurable in size and shape to accept a variety of different sprinkler-related equipment which have traditionally not been included within the sprinkler body. Sprinkler bodies are commonly used for golf-course irrigation.

A Valve Box, like a sprinkler body, contains a solenoid valve and a compartment that may be configurable in size and shape to accept a variety of different valve-related equipment. However, unlike a sprinkler body, a valve box does not include a sprinkler. Both valve boxes and sprinkler bodies contain a removable cover that is typically installed so that its top surface is flush with the surface of the ground. Valve boxes are commonly used for commercial-landscape irrigation.

A Decoder is an electronic apparatus that is connected to a two-wire path which is connected to an irrigation controller. An individual decoder connects the wire path to one solenoid valve (or sometimes several solenoid valves). Each decoder has a unique serial number that is programmed into the controller in order to distinguish it from the others in the system. Decoders thus enable controllers of two-wire systems to complete a circuit between a controller and an individual solenoid valve, thereby enabling the opening of one valve at a time.

A Station is a specific group of sprinklers controlled by a valve. Stations are generally laid out and installed according to the type of plant material to be watered, the location of the plant within the landscape, and the maximum amount of water that can be supplied. Each valve is connected to a numbered terminal within the controller, identifying it as station 1, station 2, etc. Typically, the controller operates the valves in order, one at a time. In other words, one station would water completely before another station would turn on.

A Station ID is a unique identification code assigned to a station by the controller manufacturer that enables the "brain" or microprocessor of a controller to communicate with a specific station terminal.

LoRaWAN is a Low Power, Wide Area (LPWA) networking protocol designed to wirelessly connect battery operated "things" to the internet in regional, national or global networks. LoRaWAN targets key Internet of Things (IoT) requirements such as bi-directional communication, end-to-end security, mobility and localization services. It is designed to allow low-powered apparatus to communicate with Internet-connected applications over long range wireless connections. LoRaWAN is enabled by LoRa radio hardware.

A Gateway is a piece of networking hardware used for telecommunications networks that allows data to flow from one discrete network to another. Gateways are distinct from routers or switches in that they communicate using more than one protocol. Concerning the present invention, a gateway located centrally on a site communicates to remote, battery-powered decoders via LoRaWAN; the gateway also communicates to the Internet via Cellular, Ethernet, or WiFi technology.

A Serial Cable is a cable used to transfer information between two electronic devices using a serial communication protocol.

A Mobile App (mobile application) is a computer program or software application designed to run on a mobile device such as a phone/tablet. Apps are generally downloaded from application distribution platforms which are operated by the owner of the mobile operating system, such as the App Store (iOS) or Google Play Store (Android).

A Mobile App Backend is software in the cloud that forms the underlying architecture of the mobile app. Concerning the present invention, the mobile app backend includes databases of station IDs according to controller make and model.

A User is a person who installs, configures, and uses the apparatus and method of the present invention. For example, this may be a golf-course superintendent or a commercial-landscape irrigation contractor.

SUMMARY OF THE INVENTION

An irrigation sprinkler body cover with an integrated battery-powered decoder and a method of retrofitting existing irrigation systems to wirelessly communicate with one or more battery-powered decoders over long distances (e.g., 1 kilometer) is disclosed. A typical irrigation system comprises an irrigation controller that receives user input and provides a power signal via wire to one or more AC solenoid valves.

Concerning the present invention, a controller also provides message data to a gateway. The gateway contains configurable encoder software that encodes and then wirelessly transmits the message data, for example via long-range radio hardware using 902-928 MHz frequency. The encoded data is received by a battery-powered decoder to which the message is addressed. The battery-powered decoder decodes the message data and subsequently provides a power signal via wire to one or more proximally-located DC latching solenoid valves to control the irrigation valves according to the user input.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

Figure 1:
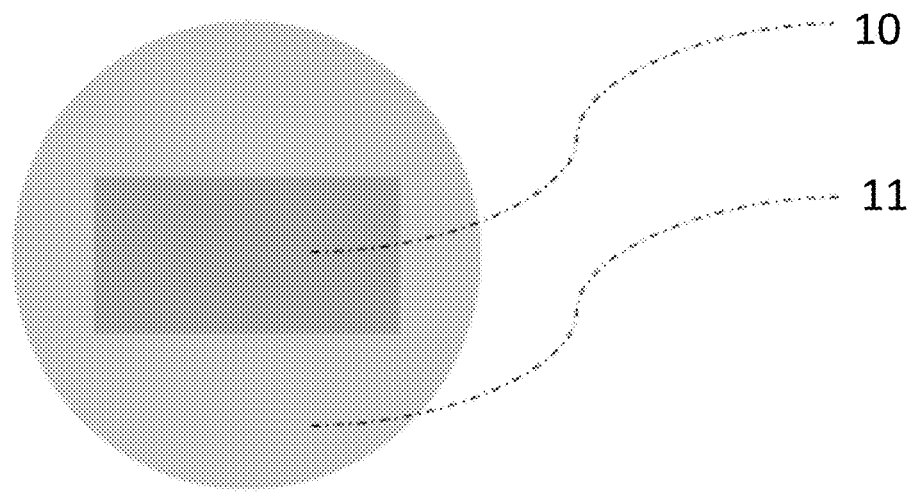
FIG. 1 is a top view of a solar embodiment of the present invention illustrating a solar panel and a plastic body cap.

In the following detailed description of exemplary embodiments of the invention, reference is made to the accompanying drawings (where like numbers represent like elements), which form a part hereof, and in which is shown by way of illustration specific exemplary embodiments in which the invention may be practiced. These embodiments are described in sufficient detail to enable those skilled in the art to practice the invention, but other embodiments may be utilized and logical, mechanical, electrical, and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known structures and techniques known to one of ordinary skill in the art have not been shown in detail in order not to obscure the invention. Referring to the figures, it is possible to see the various major elements constituting the apparatus and method of the present invention.

An irrigation sprinkler body cover with an integrated battery-powered decoder and a method of retrofitting existing irrigation systems to wirelessly communicate with one or more battery-powered decoders is disclosed. A typical irrigation system comprises an irrigation controller that receives user input and provides a power signal via wire to one or more AC solenoid valves.

Concerning the present invention, a controller also provides message data to a gateway. The gateway contains configurable encoder software that encodes and then wirelessly transmits the message data, for example via long-range radio hardware using 902-928 MHz frequency. The encoded data is received by a battery-powered decoder to which the message is addressed. The battery-powered decoder decodes the message data and subsequently provides a power signal via wire to one or more proximally-located DC latching solenoid valves to control the irrigation valves according to the user input.

Now referring to the Figures, two embodiments of a method for integrating an irrigation controller with battery-powered decoders are illustrated. The method of the present invention is embodied by a software program containing executable instruction of the method and/or process claimed by the present invention. The software program embodying the present invention is executable on a particular machine or apparatus. "Particular machine" or "apparatus" is defined as a desktop computer, laptop computer, personal data assistant (PDA), iPad, tablet, iPhone, mobile phone, smart phone, or any other equivalent electronic apparatus which is capable of running a set of executable instructions embodied by software and providing a display of the result of those instructions. These electronic apparatus used to define a particular machine or apparatus function tie the method of the present invention to a particular machine or apparatus.

FIG. 1 is a top view of a solar embodiment of the present invention illustrating a solar panel 10 and a plastic body cap 11. In this embodiment a solar panel 10 is affixed to the plastic body cap 11.

Figure 2:
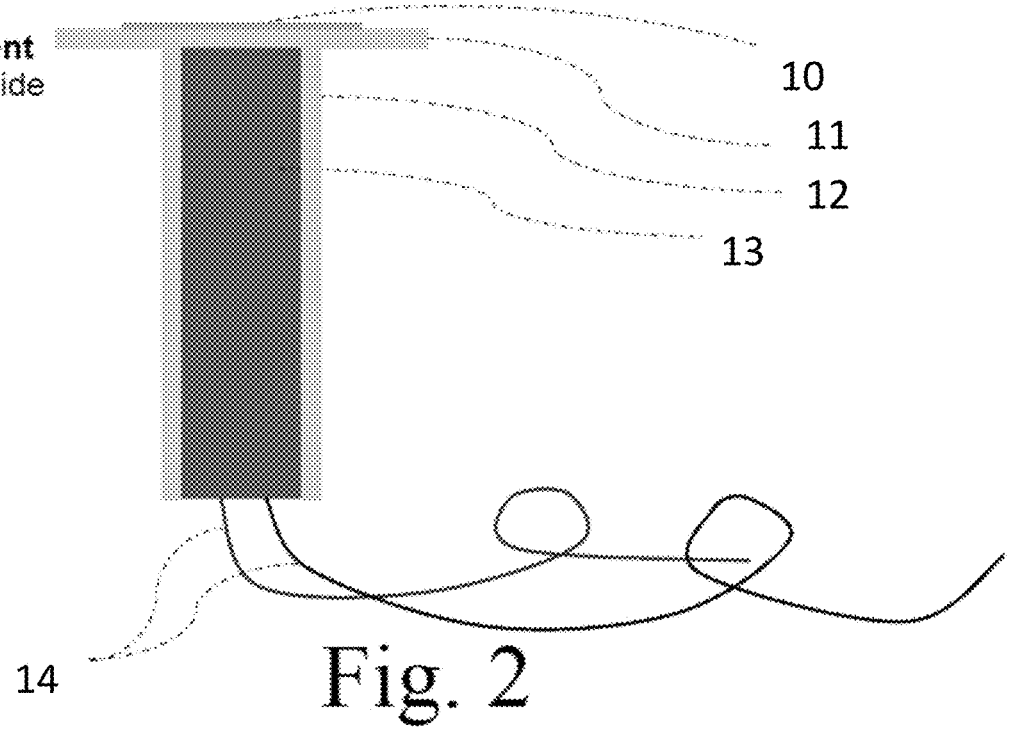
FIG. 2 is a sectional side view of a solar embodiment of the present invention illustrating a solar panel, a plastic body cap, plastic body sides, potting compound, and insulated copper wires.

FIG. 2 is a sectional side view a solar embodiment of the present invention illustrating a solar panel 10, a plastic body cap 11, plastic body sides 12, potting compound 13, and insulated copper wires 14.

Figure 3:
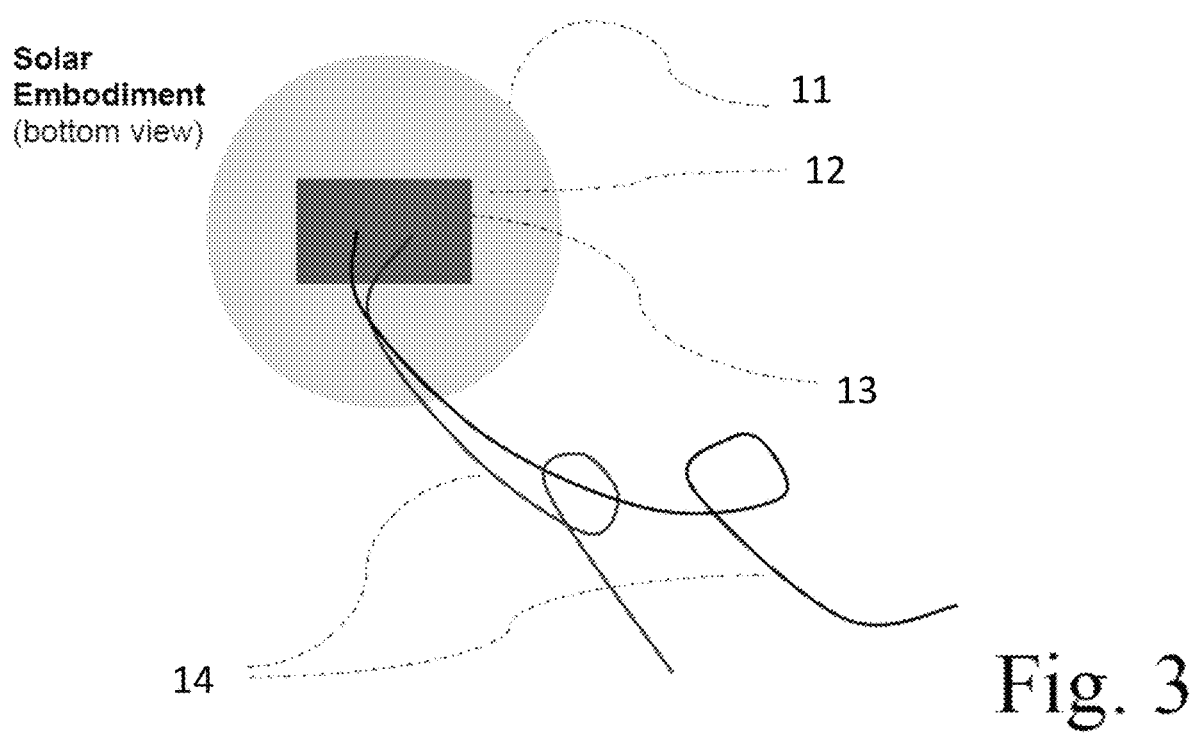
FIG. 3 is a bottom view of a solar embodiment of the present invention illustrating a plastic body cap, plastic body sides, potting compound, and insulated copper wires.

FIG. 3 is the bottom view of a solar embodiment of the present invention illustrating a plastic body cap 11, plastic body sides 12, potting compound 13, and insulated copper wires 14.

The solar panel 10 is affixed to the top surface of the plastic cap, 11 which is further comprised of plastic body sides 12 to form an open-ended, e.g., cylindrical or rectangular-box shape which encloses a PCBA (printed circuit board assembly) and lithium-ion polymer battery, which is then filled with a potting compound 13 to protect the PCBA from moisture, chemicals, mechanical shock, and provide concealment. The positive and negative wires 14 that run to the DC latching solenoid(s) extend from the PCBA and out of the open-ended, potting-filled body from the PCBA.

Figure 4:
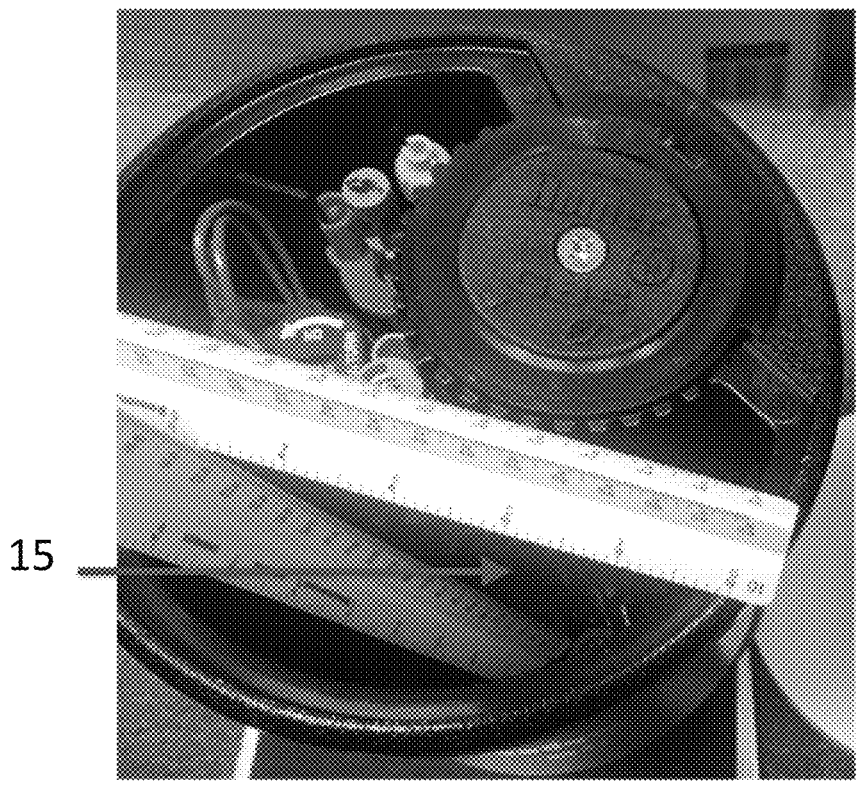
FIG. 4 is a perspective view of a prior art sprinkler body containing compartments that may be configurable in size and shape to accept a variety of different sprinkler related equipment—such as the apparatus of the present invention—which have traditionally not been included within the sprinkler body.

FIG. 4 is a perspective view of a prior art sprinkler body 15 containing compartments that may be configurable in size and shape to accept a variety of different sprinkler related equipment—such as the apparatus of the present invention—which have traditionally not been included within the sprinkler body.

Figure 5:
FIG. 5 is a perspective view of a prior art sprinkler body including a sprinkler body cover, the removal of which enables a user to easily access a sprinkler body compartment within the sprinkler body.
Figure 6:
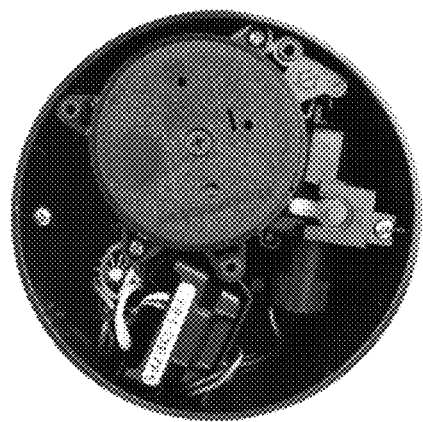
FIG. 6 is a top view of a prior art sprinkler body known in the prior art.
Figure 8:
FIG. 8 is a prior art standard DC latching solenoid known in the prior art.
Figure 9:
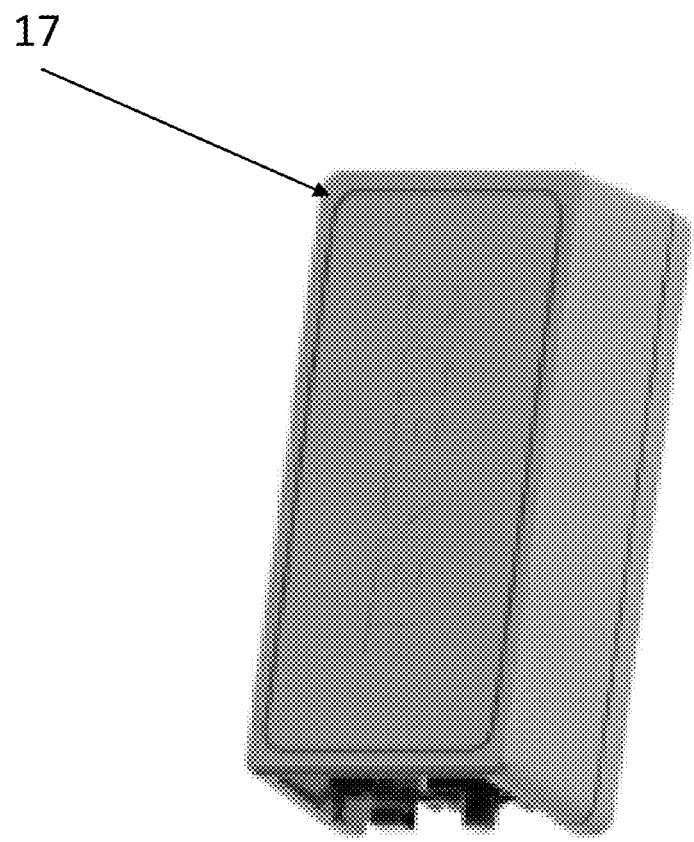
FIG. 9 is a prior art wireless (LoRaWAN) gateway known in the prior art.

The apparatus of the present invention is designed to be retrofitted to existing golf sprinkler bodies such as the TORO INFINITY 35-6/55-6 series golf sprinklers known in the prior art and shown in FIGS. 5 and 6. In this situation, for installation, a user first removes the existing sprinkler body cover. Next, the user replaces the existing AC solenoid with a DC latching solenoid as shown in FIG. 8. The user then connects +/− wires from the apparatus of the present invention to +/− wires on the DC latching solenoid. The user then secures the apparatus in sealing position over the sprinkler body compartment (i.e., in the same position that was occupied by the original sprinkler body cover). In this case, the form of the plastic body cap of the present invention is created to be identical to the form of the sprinkler body cover, thereby enabling the plastic body cap to integrate seamlessly with a sprinkler body. The apparatus of the present invention can then remotely operate the DC latching solenoid, once the apparatus is wirelessly paired with an on-site gateway as shown in FIG. 9.

FIG. 5 is a perspective view of a prior art sprinkler body including a sprinkler body cover, the removal of which enables a user to easily access a sprinkler body compartment within the sprinkler body. FIG. 6 is a top view of a prior art sprinkler body known in the prior art.

Figure 7:
FIG. 7 is a perspective view of a prior art valve box that includes a valve box cover.

FIG. 7 is a perspective view of a prior art valve box that includes a valve box cover. An alternative embodiment of the apparatus of the present invention can be integrated into a valve box cover instead of an aforementioned sprinkler body cover. Yet another alternative embodiment of the apparatus of the present invention can be inserted through a hole in the valve box cover that is cut by a user, such that the underside of the plastic cap of the present invention would sit directly above the top surface of the valve box cover. Both embodiments can then remotely operate a DC latching solenoid, once the apparatus is wirelessly paired with an on-site gateway as shown in FIG. 9.

Figure 10:
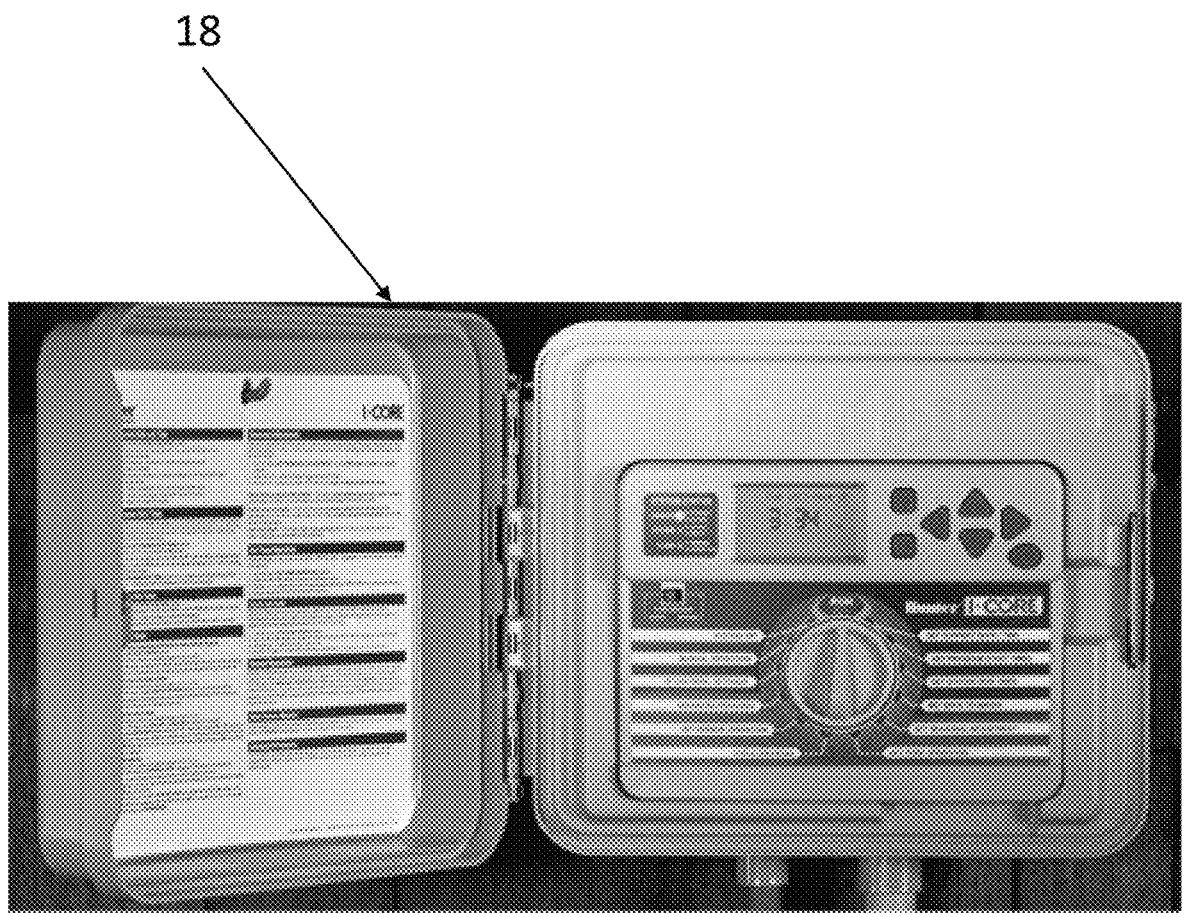
FIG. 10 is a prior art irrigation controller known in the prior art.

FIG. 8 is a standard prior art DC latching solenoid 16 known in the prior art. FIG. 9 is a prior art wireless (LoRaWAN) gateway 17 known in the prior art. FIG. 10 is a prior art irrigation controller 18 known in the prior art. The present invention enables a new and more useful combination of these prior art components.

Figure 11:
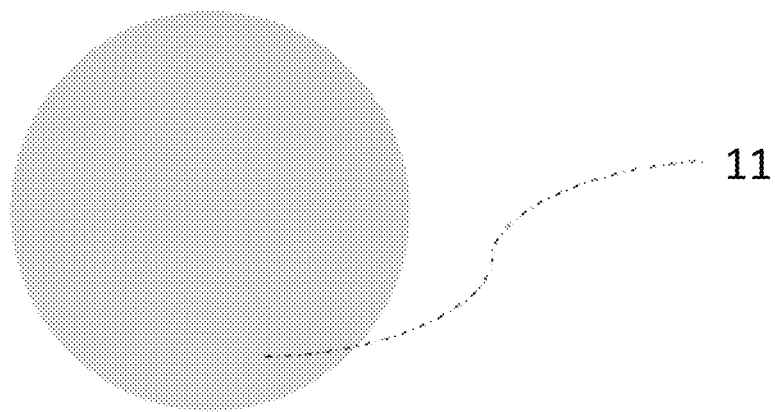
FIG. 11 is a top view of a non-solar embodiment of the present invention illustrating the plastic body cap.
Figure 12:
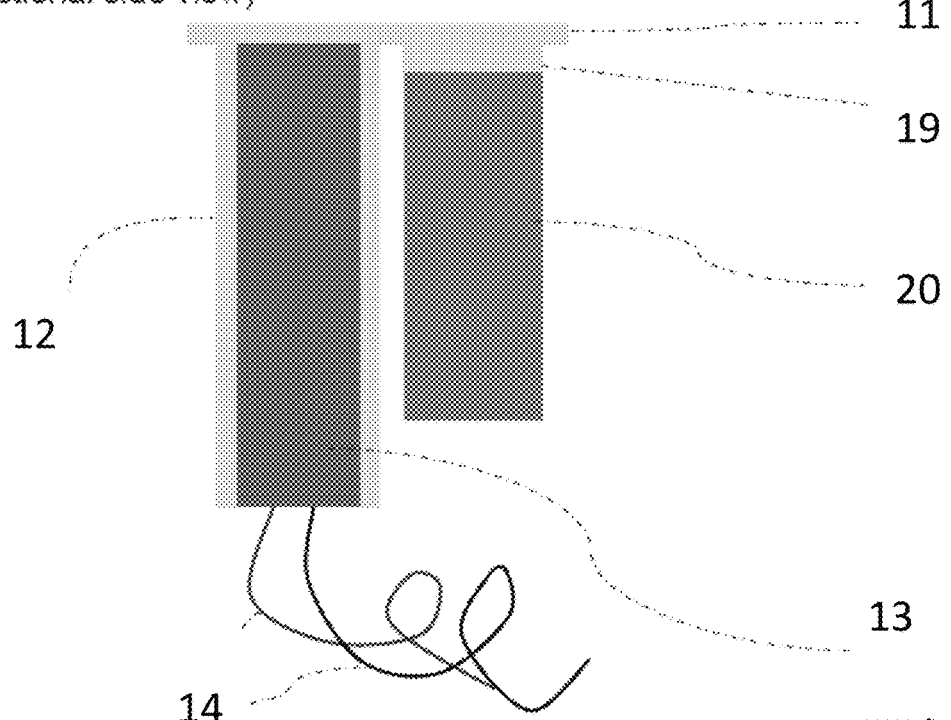
FIG. 12 is a sectional side view a non-solar embodiment of the present invention illustrating a plastic body cap, threads to mate cap and battery compartment, a battery compartment, potting compound, plastic body sides, and insulated copper wires.

FIG. 11 is a top view of a non-solar embodiment of the present invention illustrating a plastic body cap 11. FIG. 12 is a sectional side view of a non-solar embodiment of the present invention illustrating a plastic body cap 11, threads to mate cap and battery compartment 19, a battery compartment 20 in this embodiment for holding one or more batteries—D-cell for example, potting compound 13 to encapsulate the PCBA, plastic body sides 12, and insulated copper wires 14 extending from the PCBA out of the potting compound.

Figure 13:
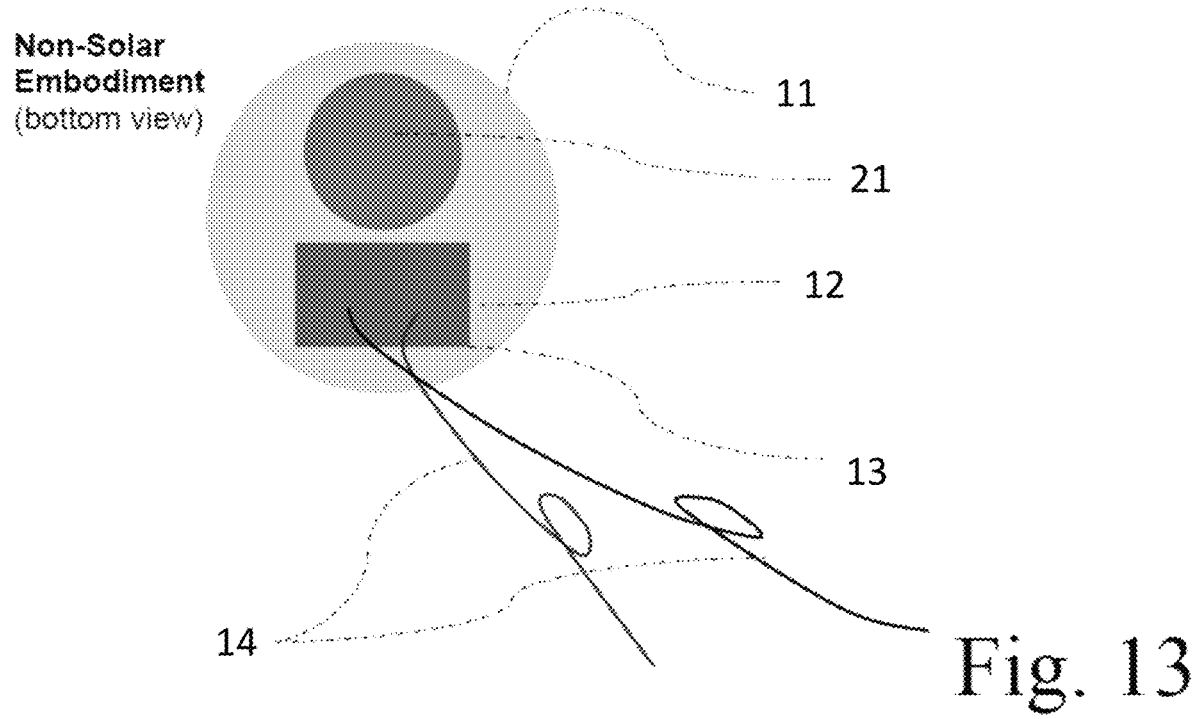
FIG. 13 is a bottom view of a non-solar embodiment of the present invention illustrating a plastic body cap, battery compartment, plastic body sides, potting compound, and insulated copper wires.

FIG. 13 is the bottom view of a non-solar embodiment of the present invention illustrating a plastic body cap 11, a battery compartment 20 for holding one or more batteries—D-cell for example, plastic body sides 12, potting compound 13, and insulated copper wires 14 extending from the PCBA out of the potting compound 13.

Figure 14:
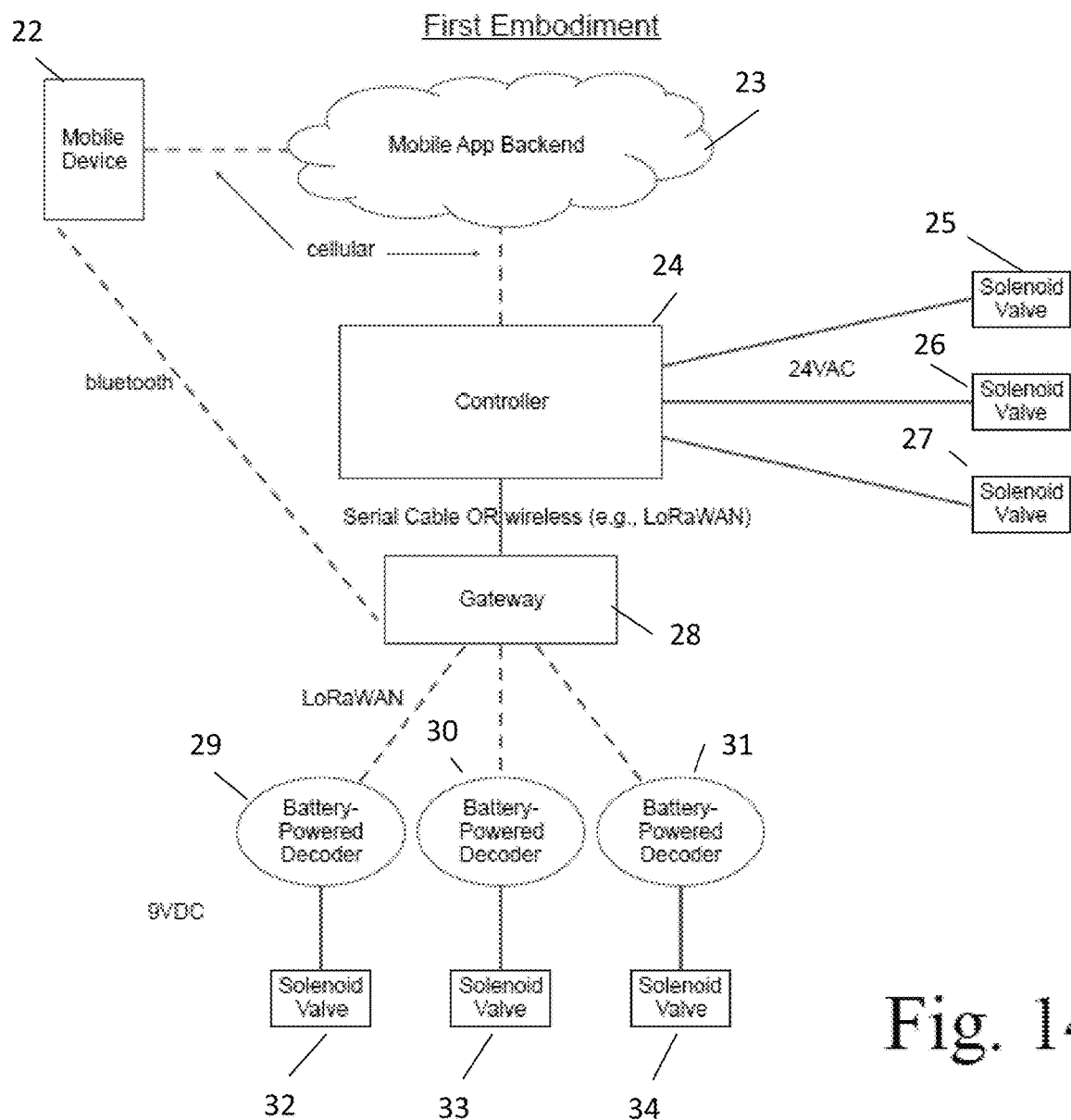
FIG. 14 is a flow chart illustrating the method of the present invention in a first embodiment.

FIG. 14 is a flow chart illustrating the method of the present invention in a first embodiment. In this embodiment, a mobile device 22 has a cellular connection to a mobile app backend 23, which also has a cellular connection to a controller 24. The controller 24 may be connected to one or more 24VAC solenoid valves 25, 26, 27. A serial cable or wireless communication technology (e.g., LoRaWAN) provides a connection from the controller 24 to a gateway 28. The gateway 28 directly communicates with the mobile device 22 via BLUETOOTH or other wireless communication technology. The gateway 28 is connected to one or more battery-powered decoders 29, 30, 31 via LoRaWAN which in turn control 9VDC solenoid valves 32, 33, 34 via +/− insulated copper wires.

Figure 15:
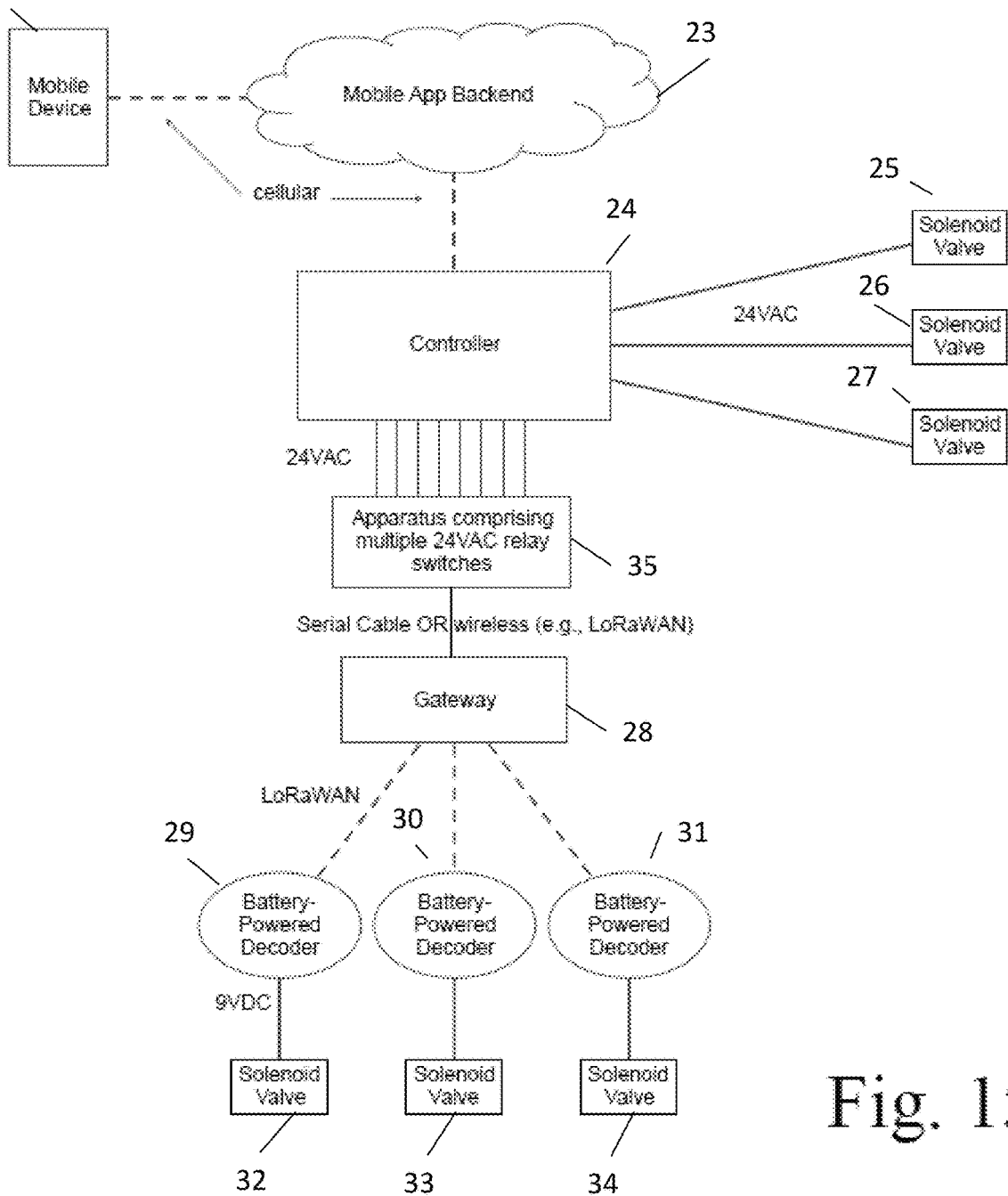
FIG. 15 is a flow chart illustrating the method of the present invention in a second embodiment.

FIG. 15 is a flow chart illustrating the method of the present invention in a second embodiment. In this embodiment, a mobile device 22 has a cellular connection to a mobile app backend 23, which also has a cellular connection to a controller 24. The controller 24 may be connected to one or more 24VAC solenoid valves 25, 26, 27 and is connected to one or more 24VAC apparatus 35 comprising one or more 24VAC relay switches. A serial cable or wireless communication technology (e.g., LoRaWAN) provides a connection from the 24VAC apparatus 35 comprising one or more 24VAC relay switches to a gateway 28. The gateway 28 is connected to one or more battery-powered decoders 29, 30, 31 via LoRaWAN which in turn control 9VDC solenoid valves 32, 33, 34 via +/− insulated copper wires.

Figure 16:
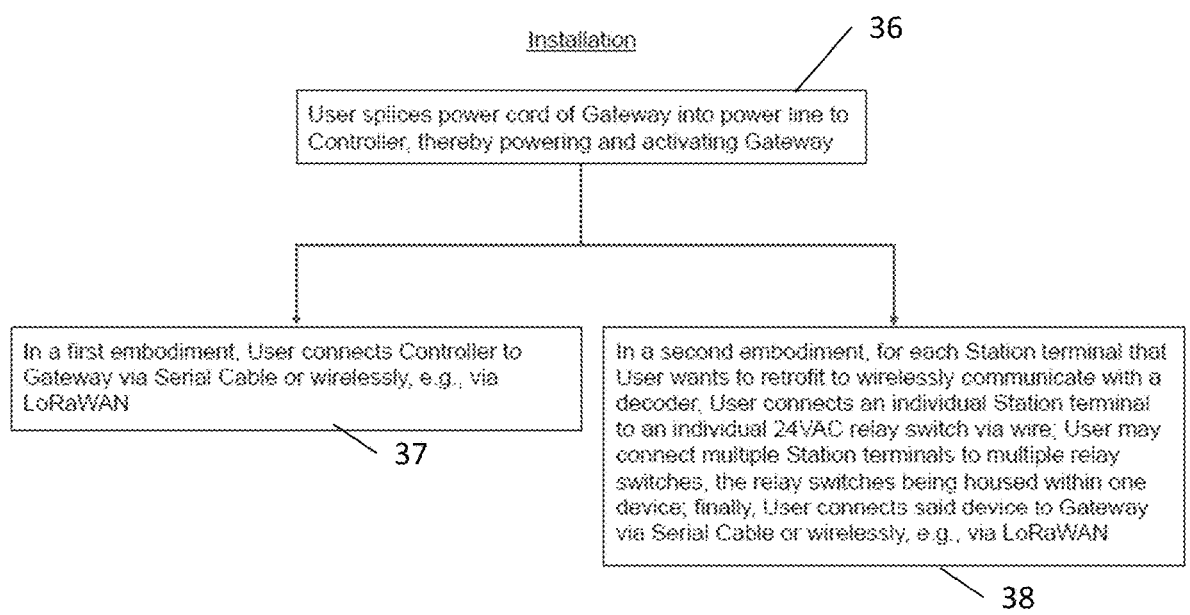
FIG. 16 is a flow chart illustrating an installation method of the present invention.

FIG. 16 is a flow chart illustrating an installation method of the present invention. First a user splices a power cord of a gateway into a power line to a controller, thereby powering and activating the gateway 36. In a first embodiment, the user connects the controller to the gateway via a serial cable or wirelessly technology (e.g., LoRaWAN) 37. In a second embodiment, for each station terminal that the user wants to retrofit to wirelessly communicate with a battery-powered decoder, the user connects an individual station terminal to an individual 24VAC relay switch via wire; the user may connect multiple station terminals to multiple relay switches, the relay switches may be housed within one or more apparatus; finally, the user connects the apparatus to the gateway via a serial cable or wireless technology (e.g., LoRaWAN) 38.

Figure 17:
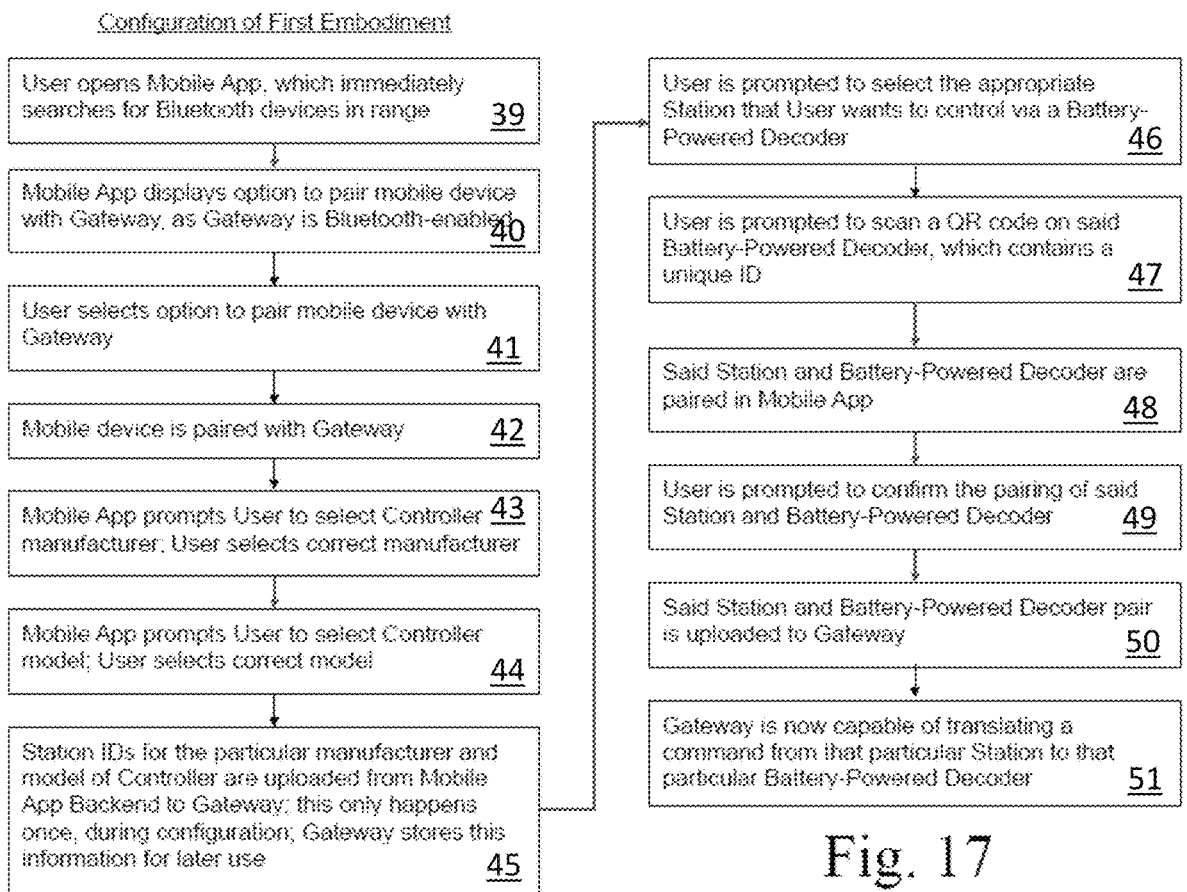
FIG. 17 is a flow chart illustrating a configuration method of a first embodiment of the present invention.

FIG. 17 is a flow chart illustrating a configuration method of a first embodiment of the present invention. First, a user opens a mobile app, which immediately searches for Bluetooth apparatus in range 39. The mobile app displays an option to pair the mobile device with a gateway, as the gateway is Bluetooth-enabled 40. Next, the user selects the option to pair the mobile device with the gateway 41. The mobile device is paired with the gateway 42. The mobile app prompts the user to select a controller manufacturer; the user then selects the correct manufacturer of their controller 43.

Next, the mobile app prompts the user to select a controller model; the user selects the correct model for their controller 44. Station IDs for the particular manufacturer and model of controller are downloaded from the mobile app backend to the gateway; this only happens once, during configuration; the gateway then stores this information for later use 45. Now, the user is prompted to select the appropriate station that the user wants to control via a selected battery-powered decoder 46. The user is then prompted to scan a code on the selected battery-powered decoder; this code contains a unique ID for the battery-powered decoder 47. The station and battery-powered decoder are then paired in the mobile app (or gateway or mobile app backend) 48. The user is prompted to confirm the pairing of the station and battery-powered decoder 49. The station and battery-powered decoder pair is then downloaded to the gateway 50. Finally, the gateway is now capable of translating a message from that particular station to that particular battery-powered decoder 51.

Figure 18:
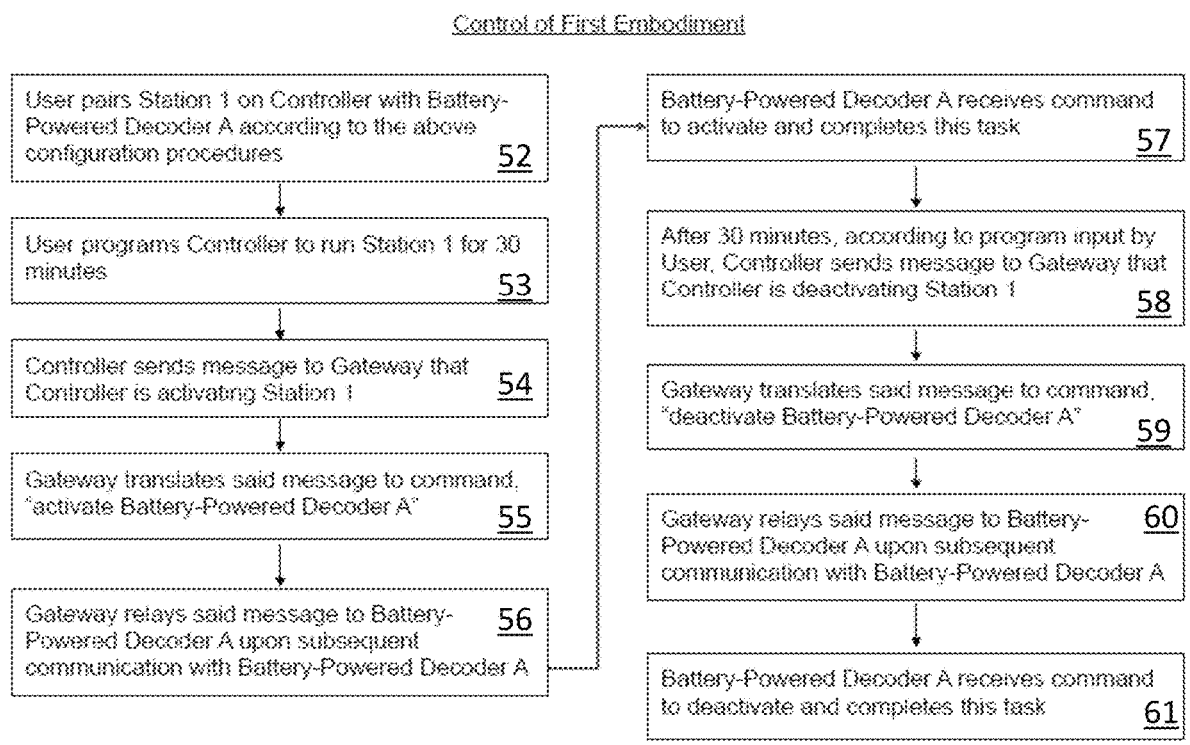
FIG. 18 is a flow chart illustrating a control method of a first embodiment of the present invention.

FIG. 18 is a flow chart illustrating a control method of a first embodiment of the present invention. First, a user pairs station 1 (for example) on the controller with battery-powered decoder A (for example) according to the above configuration procedures discussed and illustrated in FIG. 17 52. Next, the user programs the controller to run station 1 for 30 minutes 53. The controller sends a message to the gateway that the controller is activating station 1 54. The gateway translates the message to, "activate battery-powered decoder A" 55. The gateway relays the message to battery-powered decoder A upon subsequent communication with the battery-powered decoder A 56. Next, battery-powered decoder A receives the message to activate and completes this task 57.

Subsequently, after 30 minutes according to the program input by the user, the controller sends a message to the gateway that controller is deactivating station 1 58. The gateway translates the message to, "deactivate battery-powered decoder A" 59. The gateway relays the message to battery-powered decoder A upon subsequent communication with battery-powered decoder 60 A. Battery-powered decoder A receives the message to deactivate and completes this task 61.

It is appreciated that the optimum dimensional relationships for the parts of the invention, to include variation in size, materials, shape, form, function, and manner of operation, assembly and use, are deemed readily apparent and obvious to one of ordinary skill in the art, and all equivalent relationships to those illustrated in the drawings and described in the above description are intended to be encompassed by the present invention.

Furthermore, other areas of art may benefit from this method, and adjustments to the design are anticipated. Thus, the scope of the invention should be determined by the appended claims and their legal equivalents, rather than by the examples given.

The embodiments of the invention in which an exclusive property or privilege is claimed are defined as follows:

1. A battery-powered decoder apparatus comprising:
   a plastic body;
   the plastic body further comprising
      a plastic body cap with identical form to that of a sprinkler body cover, thereby enabling the apparatus to integrate seamlessly with a sprinkler body; and
      plastic body sides that form a cylindrical or rectangular-box shape;
   the plastic body houses a PCBA (printed circuit board assembly) and one or more batteries;
   the plastic body is filled with a potting compound to protect and seal the PCBA and one or more batteries;
   a solar panel;
      the solar panel is affixed to a top, external surface of the plastic body cap;
      the solar panel is connected to one or more batteries via wire;
   positive and negative wires that run to the DC latching solenoid(s) extend from the PCBA and out of the plastic body;
   the form of the plastic body cap is identical to the form of a sprinkler body cover, thereby enabling the apparatus to integrate seamlessly with a sprinkler body; and for installation,
   first removing an existing sprinkler body cover;
   replacing the existing AC solenoid with a DC latching solenoid;
   connecting +/− wires from the apparatus to +/− wires on the DC latching solenoid;
   securing the apparatus in sealing position over the sprinkler body compartment and
   the apparatus then enables remote operation of the DC latching solenoid, once the apparatus is wirelessly paired with an on-site gateway.

2. A battery-powered decoder apparatus comprising:
a plastic body;
   the plastic body further comprising
      a plastic body cap with identical form to that of a sprinkler body cover, thereby enabling the apparatus to integrate seamlessly with a sprinkler body; and
      plastic body sides that form a cylindrical or rectangular-box shape;
   the plastic body houses a PCBA (printed circuit board assembly) and one or more batteries;
   the plastic body is filled at least partially with a potting compound to protect and seal the PCBA;
positive and negative wires that run to the DC latching solenoid(s) extend from the PCBA and out of the plastic body; and
the form of the plastic body cap is identical to the form of a sprinkler body cover, thereby enabling the apparatus to integrate seamlessly with a sprinkler body for installation, and
for installation,
   first removing an existing sprinkler body cover;
   replacing the existing AC solenoid with a DC latching solenoid;
   connecting +/− wires from the apparatus to +/− wires on the DC latching solenoid;
   securing the apparatus in sealing position over the sprinkler body compartment; and
   the apparatus then enables remote operation of the DC latching solenoid, once the apparatus is wirelessly paired with an on-site gateway.

3. A method of retrofitting existing irrigation systems to wirelessly communicate with one or more battery-powered decoders, comprising the steps of
   opening a mobile app, which immediately searches for a wireless apparatus in range;
   the mobile app displays an option to pair the mobile device with the gateway, as the gateway is wirelessly-enabled;
   selecting the option to pair the mobile device with the gateway;
   the mobile device is paired with the gateway;
   the mobile app prompts selecting a controller manufacturer;
   selecting the correct manufacturer for the controller;
   the mobile app prompts selecting a controller model;
   selecting the correct model for the controller;
   station IDs for the particular manufacturer and model of controller are downloaded from the mobile app backend to the gateway; this only happens once, during configuration;
   the gateway stores this information for later use;
   the mobile app prompts selecting the appropriate station to control via a selected battery-powered decoder;
   selecting the appropriate station to control via a selected battery-powered decoder;
   the station and battery-powered decoder are then paired in the mobile app, gateway, or mobile app backend; and
   the system is now capable of translating a message from that particular station to that particular battery-powered decoder.

4. The method of claim 3, further comprising the steps of
a cable or wireless communication technology provides a connection from the controller to a gateway;
the gateway is connected to one or more battery-powered decoders via wireless communication technology which in turn control DC solenoid valves;
pairing a selected station on the controller with a selected battery-powered decoder;
programming the controller to run the station a specified duration;
the controller sends a message to the gateway that the controller is activating the station;
the gateway translates the message to activate the paired battery-powered decoder;
the gateway relays the message to the battery-powered decoder, upon subsequent communication with the battery-powered decoder;
the battery-powered decoder receives the message to activate and completes this task;
after the specified duration, according to the program input received, the controller sends a message to the gateway that the controller is deactivating the station;
the gateway translates the message to deactivate the paired battery-powered decoder;
the gateway relays the message to the battery-powered decoder upon subsequent communication with the battery-powered decoder; and
the battery-powered decoder receives the message to deactivate and completes this task.

5. The method of claim 3, further comprising the steps of
to pair a station and battery-powered decoder, the mobile app prompts scanning a code on a battery-powered decoder; this code contains a unique ID for the battery-powered decoder;
scanning the code on a battery-powered decoder;
the station and battery-powered decoder are then paired in the mobile app, gateway, or mobile app backend;
the system is now capable of translating a message from that particular station to that particular battery-powered decoder.

6. The method of claim 3, further comprising the steps of
individual controller terminals are connected via wire to individual 24VAC relay switches housed within an apparatus;
a cable or wireless communication technology provides a connection from the apparatus to a gateway; and
the gateway is connected to one or more battery-powered decoders via wireless communication technology which in turn control DC solenoid valves.

7. The method of claim 6, further comprising the steps of
opening a mobile app, which immediately searches for a wireless apparatus or gateway in range;
the mobile app displays an option to pair the mobile device with the apparatus or gateway, as the apparatus and gateway are wirelessly-enabled;
selecting the option to pair the mobile device with the apparatus or gateway;
the mobile device is paired with the apparatus or gateway;
the mobile app prompts selecting the appropriate station to control via a selected battery-powered decoder;

the mobile app prompts scanning a code on a battery-powered decoder; this code contains a unique ID for the battery-powered decoder;

the station and battery-powered decoder are then paired in the mobile app, apparatus, gateway, or mobile app backend; and the system is now capable of translating a message from that particular station to that particular battery-powered decoder.

* * * * *